(12) United States Patent
Tredwell et al.

(10) Patent No.: US 7,198,879 B1
(45) Date of Patent: Apr. 3, 2007

(54) LASER RESIST TRANSFER FOR MICROFABRICATION OF ELECTRONIC DEVICES

(75) Inventors: Timothy J. Tredwell, Fairport, NY (US); Lee W. Tutt, Webster, NY (US); David B. Kay, Rochester, NY (US); Yongtaek Hong, Webster, NY (US); Glenn T. Pearce, Webster, NY (US); Scott E. Phillips, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/240,964

(22) Filed: Sep. 30, 2005

(51) Int. Cl.
*G03F 7/34* (2006.01)
*G03F 7/38* (2006.01)

(52) U.S. Cl. .................................... 430/200; 430/201
(58) Field of Classification Search ............... 430/200, 430/201
See application file for complete search history.

(56) References Cited

U.S. PATENT DOCUMENTS

| | | | |
|---|---|---|---|
| 4,772,582 A | 9/1988 | DeBoer | |
| 4,876,235 A | 10/1989 | DeBoer | |
| 4,973,572 A | 11/1990 | DeBoer | |
| 5,516,622 A * | 5/1996 | Savini et al. | ............... 430/200 |
| 5,578,416 A | 11/1996 | Tutt | |
| 5,858,607 A | 1/1999 | Burberry et al. | |
| 5,891,602 A | 4/1999 | Neumann | |
| 6,136,509 A | 10/2000 | Gelbart | |
| 6,165,671 A | 12/2000 | Weidner et al. | |
| 6,190,827 B1 | 2/2001 | Weidner | |
| 6,252,621 B1 | 6/2001 | Kessler et al. | |
| 6,695,029 B2 | 2/2004 | Phillips et al. | |
| 6,787,283 B1 | 9/2004 | Aoai et al. | |
| 6,855,384 B1 | 2/2005 | Nirmal et al. | |
| 2002/0164535 A1 * | 11/2002 | Hoffend et al. | ............... 430/20 |
| 2003/0162108 A1 | 8/2003 | Burberry et al. | |
| 2005/0074705 A1 | 4/2005 | Toyoda | |

* cited by examiner

*Primary Examiner*—Richard L. Schilling
(74) *Attorney, Agent, or Firm*—Nelson Adrian Blish

(57) ABSTRACT

A method for forming a resist pattern on a substrate (18) places a donor element (12) having a layer of thermoresist material proximate the substrate. A gap is maintained such that the surface of the layer of thermoresist material is spaced apart from the surface of the substrate by a number of spacing elements. Thermal energy is directed toward the donor element (12) according to the resist pattern, whereby a portion of thermoresist material is transferred from the donor element (12) across the gap by ablative transfer and is deposited onto the substrate (18) forming the resist pattern.

35 Claims, 6 Drawing Sheets

LASER RESIST TRANSFER FOR MICROFABRICATION OF ELECTRONIC DEVICES

CROSS REFERENCE TO RELATED APPLICATIONS

Reference is made to commonly-assigned copending U.S. patent application Ser. No. 11/241,370, filed Sep. 30, 2005, entitled PATTERNING OLED DEVICE ELECTRODES AND OPTICAL MATERIAL by Newman et al.; and U.S. patent application Ser. No. 10/944,586, filed Sep. 17, 2004, entitled METHOD OF FORMING A STRUCTURED SURFACE USING ABLATABLE RADIATION SENSITIVE MATERIAL, by Ali et al., the disclosures of which are incorporated herein.

FIELD OF THE INVENTION

The present invention relates, in general, to fabrication of microelectronic devices and in particular to fabrication of microelectronic devices using a dry process with a resist formed by laser transfer.

BACKGROUND OF THE INVENTION

Lithographic patterning techniques have been employed in conventional fabrication of microelectronic devices, including thin film transistor (TFT) arrays for flat panel application. Conventional photoresist lithographic techniques applied to microfabrication have proved capable of defining structures and forming regions of material on a substrate to within dimensions of about 100 nm.

Based on a printing model, the lithographic process forms a pattern of areas that are either receptive or repellent (non-receptive) to a coating (such as ink) or to some other treatment. Conventional photolithography requires a small number of basic steps, with variations according to the materials used and other factors. A typical sequence is as follows:
  (i) wet coating of a positive-working or negative-working photoresist (such as by spin-coating);
  (ii) prebake of the photoresist;
  (iii) forming the pattern by exposure to some form of electromagnetic radiation through an overlay mask using an optical mask aligner;
  (iv) curing of the masked pattern, such as by postbake; and
  (v) removal of the uncured portion, using a liquid etchant.

Following subsequent coating or treatment of the surface, the protective photoresist pattern can then itself be removed.

Steps (i)–(v) may be performed in air, such as in a clean room environment, and are typically performed using separate pieces of equipment. Alternately, one or more steps, such as coating deposition, may be performed in vacuum. Because of the very different nature of processes carried out in each of these steps, it would be difficult and costly to combine steps (i)–(v) in any type of automated, continuous fabrication system or apparatus.

Considerable effort has been expended to improve upon conventional methods as listed in steps (i)–(v) above in order to achieve better dimensional resolution, lower cost, and eliminate the use of chemicals such as etchants. One improvement of particular benefit has been the refinement of plasma etching techniques that eliminate the need for liquid etchants. With reference to step (v) listed above, the use of plasma etching is an enabler for performing microlithographic fabrication in a dry environment.

As is well known to those skilled in the microlithographic art, conventional photoresist materials follow "reciprocity law," responding to the total exposure received, the integral of illumination over time. Among disadvantages of conventional photoresist use is the requirement for careful control of ambient illumination until curing is complete. Conventional photoresists are typically exposed with light in the UV portion of the spectrum, where photon energy is particularly high. Examples of photoresists used microfabrication of semiconductor components are given in U.S. Pat. No. 6,787,283 (Aoai et al.)

Due to this response characteristic and other shortcomings of photoresists, another type of resist material, namely thermoresist material, has proved to be more suitable for microlithographic fabrication. Thermoresist responds to heat energy rather than to accumulated exposure over time. Most thermoresists respond to radiation in the IR and near-IR range and may be casually termed "IR resists." However, there can also be alternative thermoresists in the UV region, as described, for example, in U.S. Pat. No. 6,136,509 (Gelbart).

The use of thermoresist offers advantages for providing a dry process alternative to conventional coating (step (i) given above). Moreover, where a thermoresist pattern can be applied directly to a substrate using highly focused radiant energy, the need for masks is eliminated or minimized and both pre-bake and curing processes (steps (ii) and (iv) above) may no longer apply.

Recognizing these advantages, a number of patent disclosures have proposed thermoresist application using laser energy, including the following:

U.S. Pat. No. 5,858,607 (Burberry et al.) discloses a method for directly transferring patterning material from a donor sheet to a lithographic printing plate. A hydrophilic lithographic printing support such as aluminum or coated polyester is overlaid with a coated donor sheet. The donor sheet contains a transfer layer containing a material that absorbs laser radiation and a polymeric binder having reoccurring units of the following units of the following formula:

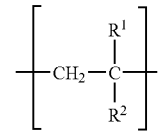

Wherein R1 represents cyano, isocyanate, azide, sulfonyl, nitro, phosphoric, phosphonyl, hetroaryl, or R2 is Hydrogen, alkyl or from the same list as R1 and a receiver element consisting of a support having a hydrophilic surface such that upon imagewise heating the binder is transferred to the hydrophilic receiver surface. The assemblage is image wise exposed with a high intensity laser beam that transfers binder to receiver. The transfer requires relatively low exposure, with no chemical or solution processing of the plate and no post-bake or other post processing.

U.S. Pat. No. 6,855,384 (Nirmal et al.) discloses a process for patterning a light emitting polymer, forming the emissive layer of an organic electroluminescent device. The Nirmal et al. '384 process provides a transfer donor sheet, bringing the donor sheet into close proximity with a receptor substrate, and selectively thermally transferring the transfer layer from the donor to the receptor. The donor sheet includes a substrate and a transfer layer that includes a blend of a light emitting polymer and an additive. The additive can be selected to promote high fidelity thermal transfer of the transfer layer. U.S. Patent Application Publication No. 2005/0074705 (Toyoda) discloses adhesive transfer of a resist material from a donor sheet to a substrate. In the Toyoda '74705 method, a layer of resist material is fused or melted onto the substrate by means of an irradiating beam of energy. The unfused donor material is then lifted off, leaving the resist pattern adhered to the substrate surface.

Advantageously, the methods of the Burberry et al. '607, Nirmal et al. '384, and Toyoda '74705 disclosures provide a dry process, eliminating any requirement to coat the substrate initially with uncured resist material, eliminating or reducing masking requirements, and allowing the use of plasma etching techniques. However, in spite of these advantages, some performance drawbacks remain.

Adhesive transfer, used in the methods of each of these disclosures, has inherent limitations for maintaining precise tolerances. To illustrate this, FIGS. 1 and 2 represent the adhesive transfer process in simplified schematic form, showing side views (not to scale). Referring to FIG. 1, in an adhesive transfer patterning apparatus 10, a donor sheet 70 having a transfer layer 68, such as a layer of thermoresist material, on a support 72 is placed directly against a substrate 18. A laser beam 26, or some other form of highly focused radiant energy, is applied to donor sheet 70. In the immediate area where laser beam 26 is incident, a photothermal conversion takes place, melting a corresponding portion of transfer layer 68 and thus adhering this portion to the surface of substrate 18. Adhesive transfer is sometimes suitably termed "melt" transfer.

FIG. 2 shows a familiar problem with adhesive transfer. This problem occurs as donor sheet 70 is pulled away from substrate 18. As shown more clearly in the magnified area labeled Q, a feature 74 is formed wherever some portion of transfer layer 68 is adhered to the surface of substrate 18. Here, feature 74 is a portion of the thermoresist pattern, with transfer layer 68 being a thermoresist material. Ideally, at the edge of feature 74 or other structure of resist material, a clean separation occurs between that portion of the resist donor that is intended to stick to substrate 18 and the other portion that is lifted off and "torn away" from adhered feature 74. One of two problems is possible, however, as illustrated in FIG. 2. First, as shown by an excess portion 76 in FIG. 2, a portion of the un-adhered resist donor may not separate cleanly when overlaying donor sheet 70 is removed. Excess portion 76 may even be inadvertently adhered to the substrate 18 surface, such as through overheating, or may be torn from the balance of transfer layer 68. The existence of excess portion 76 may lead to jagged edges of circuit traces, for example.

A second possible problem relates to a portion of the adhered resist transfer layer 68 that is not perfectly affixed to substrate 18, due to some slight surface imperfection for example, or due to excessive thickness or strength of the surrounding un-adhered resist donor on resist transfer layer 68. In FIG. 2, a torn portion 78 is lifted off along with donor sheet 70. Where torn portion 78 is small, there may be no perceptible effects. However, in some cases, this effect could cause jagged edges of surface features where excessive resist material has been removed.

Various measures can be taken to lessen the likelihood of torn portions and to improve overall adhesion bonding. For example, to counter such effects and obtain clean separation from the donor sheet, the Toyoda '74705 disclosure even suggests the addition of a mold-releasing lubricant or other agent in the donor sheet structure. But because it is not possible to obtain perfect separation between adhered and un-adhered portions of a pattern, adhesive transfer, as proposed in the Burberry et al. '607, Nirmal et al. '384, and Toyoda '74705 disclosures, suffers from inherent problems in maintaining precision edge definition. This, in turn, limits the dimensional resolution that can be obtained for a resist pattern formed using adhesion bonding methods.

A further, significant disadvantage of adhesive transfer relates to overall energy level requirements. When a donor sheet is in flush contact with a receiver substrate, the laser spot necessarily loses some amount of heat through thermal diffusion. This effect, in turn, requires the use of higher exposures to effect any physical change needed for melting and adhesion. Thermal diffusion can be particularly troublesome when the receiving substrate is a metal surface with a high thermal conductivity.

Yet other disadvantages of adhesive transfer relate to the need for intimate, planar surface contact between donor and receiver substrate. Accuracy and high resolution require that the donor be in contact with the receiver during adhesive transfer. The presence of any type of surface features on the receiver surface tends to separate the donor from the receiver surface, resulting in less-than-ideal bonding conditions for precision transfer using adhesive transfer techniques. Similarly, dust or dirt particles, inevitable even in controlled "clean room" environments, may settle between the surfaces of the donor and receiver substrate. Imperfect adhesion bonding caused by dust or other particulate can have a pronounced effect, resulting in a drop-out near the point of contact.

Thus, there is a need for an apparatus and method for thermoresist patterning on a substrate using dry media that allows improved edge definition between adhered resist and surrounding areas, that does not direct excessive heat levels onto the donor or receiver substrate, that works well for transfer onto a featured surface, and that is more robust with respect to dust and dirt than is conventional adhesive transfer.

SUMMARY OF THE INVENTION

In response to the need for improved thermoresist patterning, the present invention provides a method for forming a resist pattern on a substrate comprising:

a) placing a donor element comprising a layer of thermoresist material proximate the substrate;

b) maintaining a gap such that the surface of the layer of thermoresist material is spaced apart from the surface of the substrate by a plurality of spacing elements; and c) directing a thermal energy toward the donor element according to the resist pattern, whereby a portion of thermoresist material is transferred from the donor element across the gap by ablative transfer and is deposited onto the substrate, forming the resist pattern.

The invention and its objects and advantages will become more apparent in the detailed description of the preferred embodiment presented below.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

Figure 1:
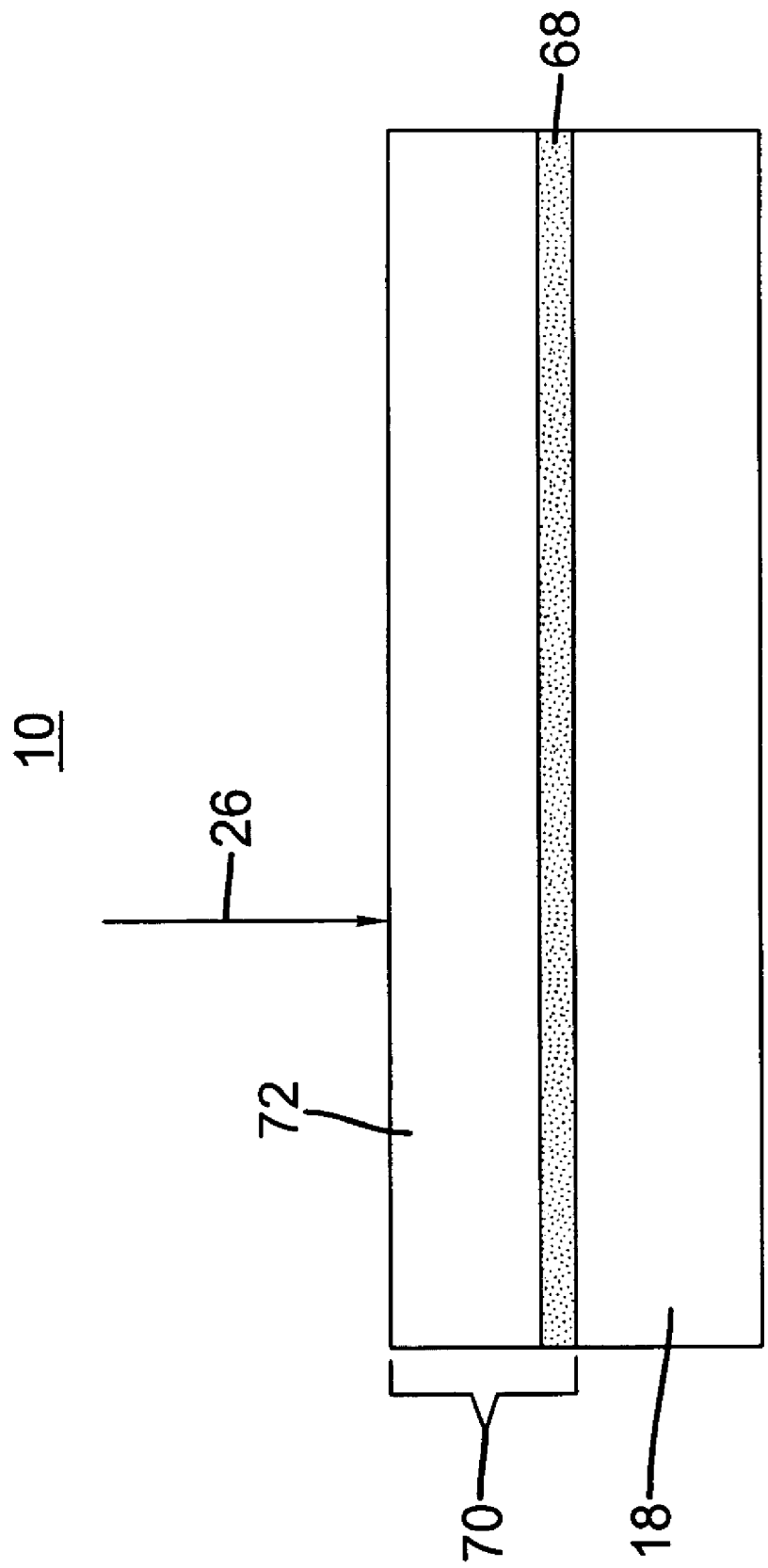
FIG. 1 is a block diagram showing a patterning apparatus using conventional adhesive transfer.

The present invention will be directed in particular to elements forming part of, or in cooperation more directly with the apparatus in accordance with the present invention. It is to be understood that elements not specifically shown or described may take various forms well known to those skilled in the art.

Unlike adhesive transfer methods described earlier in the background section, the patterning process of the present invention utilizes ablative transfer of a resist material from a donor element onto the layer to be patterned using thermal or optical energy. In this process, a donor element, such as a donor sheet or other article coated with a resist material (organic or inorganic) is brought into very close proximity to a receiver, such as a TFT substrate, to be patterned with a layer of a material (such as aluminum). A scanned laser beam (or laser head) transfers the resist material from the donor element to the receiver in a pattern, wherever the donor was exposed. The resist pattern can be written onto the substrate through a mask. Alternately, a digital writing or direct-write process, such as that used for silicon wafers (that is, maskless lithography) can be employed. The resist pattern formed in this manner need not be further treated or cured in most applications.

After removal of the donor element, the substrate continues into etching, either wet etch or plasma etch. As in conventional etching, the deposited layer is removed wherever the resist was not protecting that layer. The resist could then be stripped, such as by oxygen plasma, and the substrate would continue to further fabrication steps, such as additional pattern deposition.

The background section given above described problems with adhesive transfer of thermoresist material from a donor medium. To overcome problems inherent to adhesive transfer, the present invention employs ablative material transfer, across a gap, from the donor medium to a receiver substrate. The term "ablative transfer" is broadly understood to be a heat-induced transfer from the donor medium, wherein at least a portion of a component of the donor medium is converted to a gaseous state. The material that is converted to gaseous state may be the resist material itself or may be some other component material of the donor that thus serves as a propellant for ablative transfer. In either case, expansion to gaseous form creates a propellant force that acts as the transfer mechanism in ablative transfer. The broad classification of ablative transfer can include sublimation transfer in which some or all of the resist donor material that is heated is converted from a solid to a vapor. Ablative transfer also includes fragmentation transfer or particulate transfer, in which at least some portion of the donor material may not actually be converted to gaseous state, but is effectively fragmented and propelled by the conversion to vapor form of some heated component of the donor. In ablative transfer, the donor resist material is propelled across a gap between the surface of the donor and receiver substrate. The vaporization and gaseous flow mechanisms of ablative transfer differentiate this transfer method from conventional adhesive transfer, which relies on intimate contact (that is, having no gap) between donor and receiver, and which uses some type of melting that transfers the resist material between donor and receiver.

Figure 2:
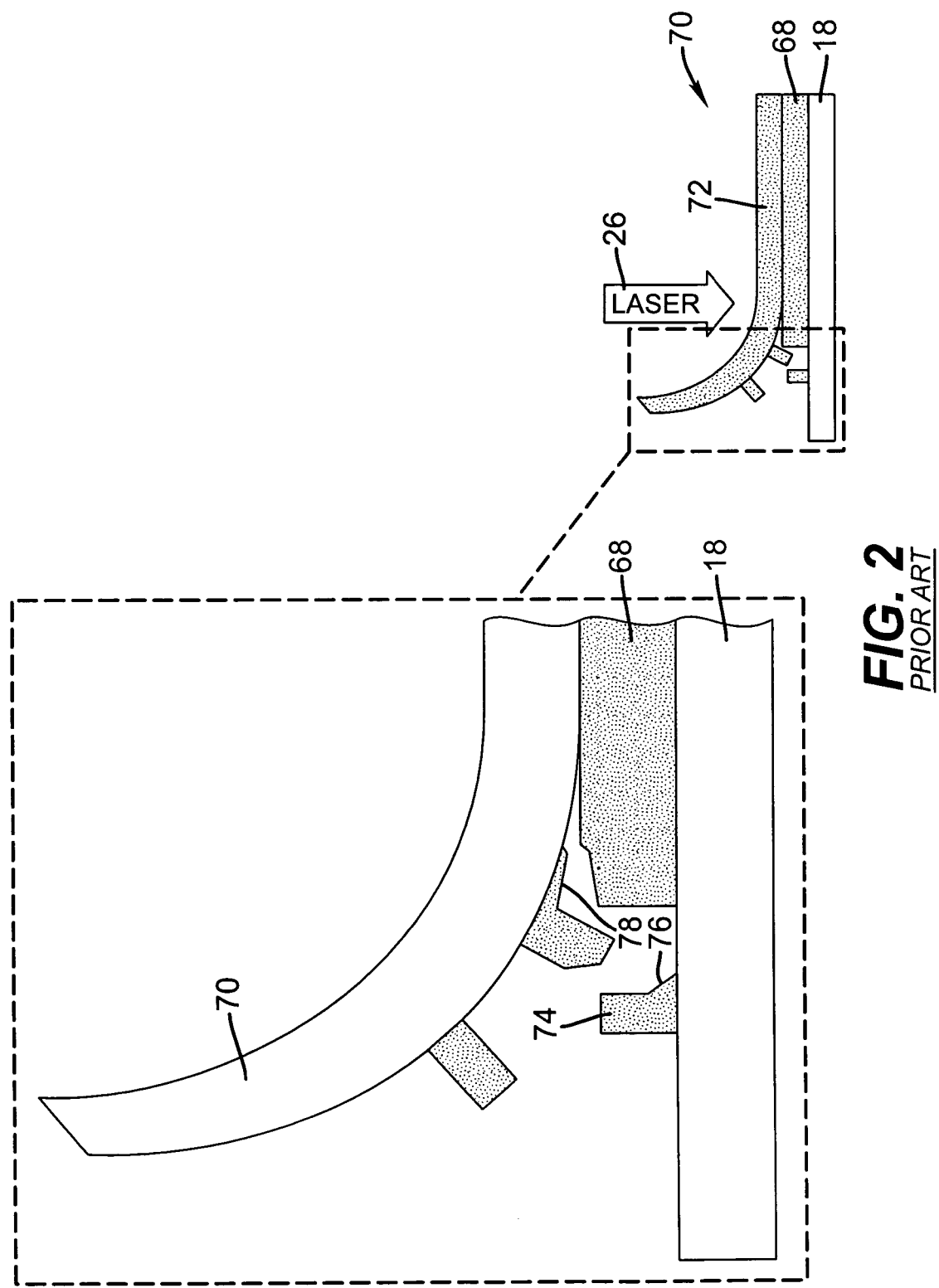
FIG. 2 is a block diagram showing a significant problem with adhesive transfer upon donor removal.

Initially developed in order to support colorant transfer from a donor to a receiver medium, the ablative transfer technique takes advantage of the gap between the donor and receiver surfaces to prevent some of the problems inherent to adhesive transfer, as was described with reference to FIG. 1. In the transfer process, thermoresist material to be deposited, or some other material in the donor that serves as a propellant, is heated to a state of sublimation or ablation, causing partial or full vaporization of at least some component of the donor, rather than melting of thermoresist material. Under suitable heating from a laser or other source, the resulting vapor and/or ablated solids travel across the gap, from the donor to the receiver surface, in a partially or fully vaporized form. At the receiver (substrate 18), deposition of the resulting vapor and ablated solids builds up the surface features 74 (as were shown in FIG. 2) that form the thermoresist pattern.

There are a number of propellant materials that can be used for ablative transfer. Propellant materials would be disposed within the donor (for example, in radiation-absorbing layer 36, FIG. 4) such that heat absorbed by the propellant material from the laser or light source generates gas or vapor that provides the force needed to direct the resist material across the gap and onto the receiving substrate. Materials suitable for this function include polycyanoacrylates (PCyA) and copolymers of Maleic anhydride (Gantrez Resins). Other types of polymers may also be suitable.

Figure 3:
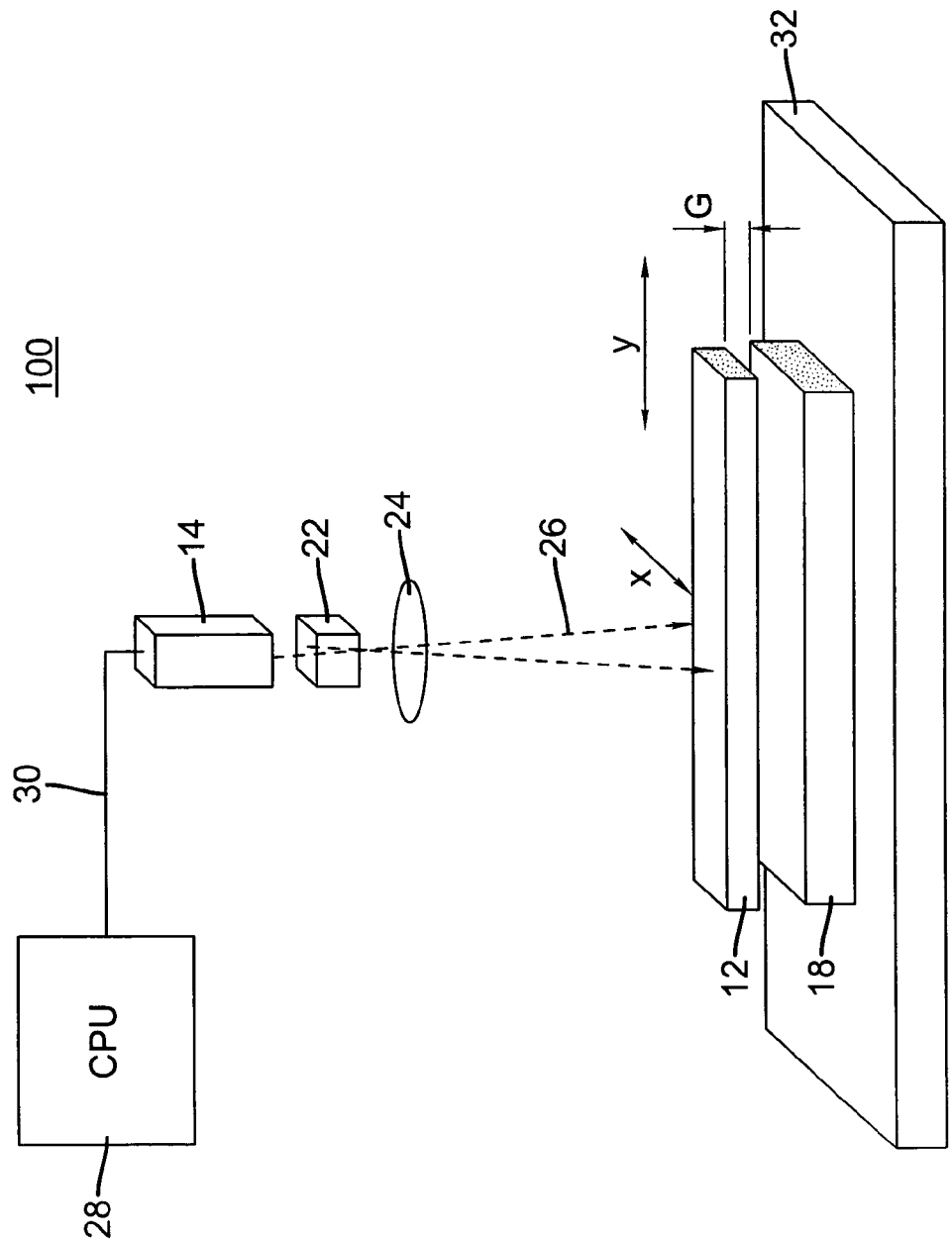
FIG. 3 is a block diagram showing a patterning apparatus for applying a thermoresist pattern according to the present invention.

Turning now to FIG. 3, there is shown a patterning apparatus 100 for transferring material from a donor transfer element such as a donor sheet, which will hereinafter be referred to as a donor element 12, onto substrate 18 in accordance with the ablative transfer of the present invention. Laser 14 of the patterning apparatus 100 can be a diode laser or any other high power laser that produces laser beam 26. More than one laser 14 or laser beam 26 can be used simultaneously in this invention. In order to scan laser beam 26 to provide relative movement between laser beam 26 and donor element 12, a galvanometer 22 that includes a moveable mirror scans the beam through an f-theta lens 24 to form a scan line in direction X. Those skilled in the art will understand that scanning the laser beam can also be accomplished by other kinds of moveable reflective surfaces, such as rotating polygons with mirror faces, or by other devices such as rotating diffraction gratings. Alternately, the needed relative movement could be provided by moving substrate 18 relative to laser beam 26.

In the embodiment shown in FIG. 3, donor element 12 and substrate 18 are transported in a direction Y, which is orthogonal to the scan line, by a translation stage 32 allowing the full area to be scanned. The intensity of beam 26 at any point in the scan is controlled by the laser power control line 30 using instructions from a control logic processor 28. Alternatively, the intensity of laser beam 26 can be controlled by a separate modulator such as an acousto-optic modulator (not shown), as is well known by those skilled in the art of laser optics. In an alternative embodiment, substrate 18 can remain stationary and the laser writing apparatus made to move or laser beam 26 redirected optically. The important feature is that there is relative movement between laser beam 26 and substrate 18 in order to allow full area scanning.

Figure 4:
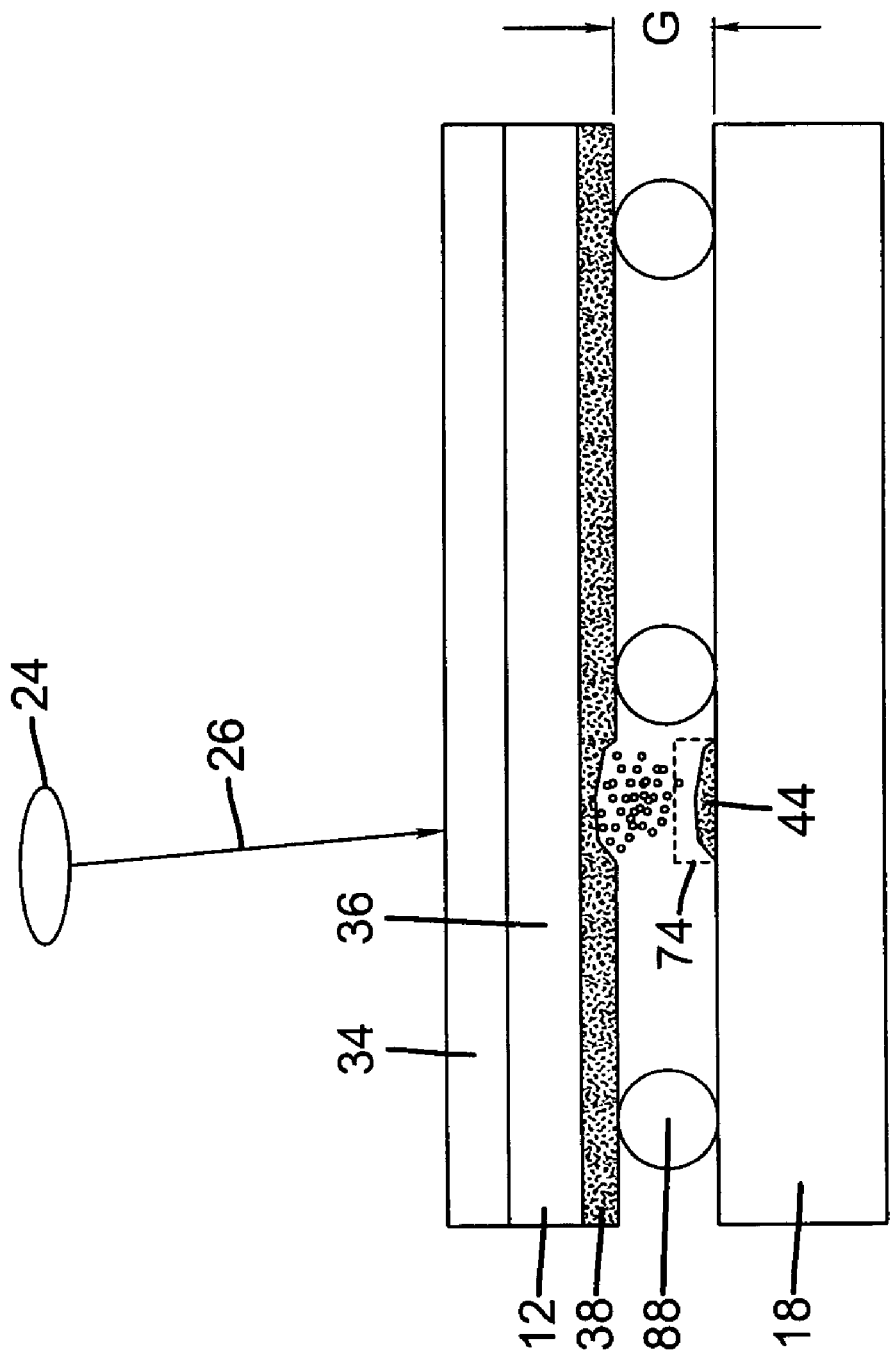
FIG. 4 is a cross-sectional side view, not to scale, showing components at the donor/substrate interface.

As shown in FIG. 3, donor element 12 is positioned in transfer relationship to display substrate 18. Structure, materials, and fabrication of donor element 12 and substrate 18 are discussed in more detail below. Donor element 12 and substrate 18 may be held in position by clamping, application of pressure, adhesives, or the like, with optional heating of either or both donor element 12 and substrate 18. One example of a fixture for this positioning is disclosed in commonly-assigned U.S. Pat. No. 6,695,029 (Phillips et al.), the disclosure of which is hereby incorporated by reference. It is preferred that transfer take place under an inert atmosphere, such as nitrogen or argon, or under vacuum. As shown in FIGS. 3 and 4, there is a gap G maintained between donor element 12 and the portions of substrate 18 to which material transfer is desired. Spacers 88, such as embedded beads or other spacing elements, are used to maintain gap G.

Referring to both FIGS. 3 and 4, F-theta lens 24 focuses laser beam 26 onto a radiation-absorbing layer 36 of donor element 12 while galvanometer 22 scans the beam. Laser beam 26 must have sufficient power to heat radiation-absorbing layer 36 to a temperature high enough to cause ablative transfer so that the material in a transfer thermoresist layer 38, also termed a resist layer, is propelled toward display substrate 18, thereby forming a transferred resist portion 44 on substrate 18. FIG. 4 represents feature 74 that is to be formed in dotted outline.

In one embodiment, ablative transfer occurs by partial or full vaporization of the material in thermoresist layer 38 with subsequent deposition onto the display substrate 18. The spot size geometry of f-theta lens 24 dictates the area of the thermoresist layer 38 that will be transferred. The arrangement is such that, when laser beam 26 has sufficient power for a given rate of scan, the spot size causes material from the irradiated portion of thermoresist layer 38 to be selectively transferred, across gap G, from donor element 12 to designated areas similar to "pixels" on substrate 18. In FIG. 3, laser beam 26 is represented as two spaced arrows. For convenience of illustration, it should be understood that laser beam 26 has actually been moved between two different positions where it is turned on for transferring portions of resist layer 38.

In a preferred embodiment (FIG. 3), laser beam 26 is continuously scanned by galvanometer 22 across donor element 12 while the laser power is modulated by instructions from control logic processor 28. The modulation of laser power incident on donor element 12 causes transfer of the resist material in thermoresist layer 38 in selectable amounts in selected regions of the scan to substrate 18. In a preferred embodiment, most or all of the material in resist layer 38 is transferred to substrate 18.

Laser 14 must be matched to suit the composition of the thermoresist material in resist layer 38 and to suit other materials used for ablative transfer in radiation-absorbing layer 36. For most types of thermoresists that can be used, laser 14 can be an infrared solid-state laser, a neodynium YAG laser or any other laser providing a sufficient power to effect transfer of the resist layer. The power necessary depends on matching the absorption of radiation-absorbing layer 36 with the wavelength of laser 14. The spot shape may be oval to allow small lines to be written while using low cost multimode lasers, as taught in commonly-assigned U.S. Pat. No. 6,252,621 (Kessler et al.), the disclosure of which is hereby incorporated by reference.

In the preferred embodiment, donor element 12 used in the transfer process comprises a donor support 34 that is transmissive to the laser light, radiation-absorbing layer 36 for transfer assist that converts the laser light into heat, and resist layer 38 to be transferred. In separate embodiments, resist layer 38 can also act as a radiation-absorbing layer in addition to layer 36, or alternatively, layer 36 can be eliminated. As yet another alternative, support layer 34 can also serve as the radiation-absorbing layer, and separate layer 36 can be eliminated. Examples of donor support and radiation-absorbing materials that can be used in this invention can be found in U.S. Pat. No. 4,772,582 (DeBoer). Donor support 34 must be capable of maintaining the structural integrity during the light-to-heat-induced transfer. Support materials meeting these requirements include, for example, glass, metal foils, plastic (polymeric) foils, and fiber-reinforced plastic foils. Plastic foils are highly advantaged for most applications. While selection of suitable support materials can be based on their suitability to handling the incident laser radiation, using known engineering approaches, it will be appreciated that other aspects of a selected support material may merit special consideration when configured as a donor support for the present invention. For example, some support materials may require a multistep cleaning and surface preparation process prior to precoating with transferable resist material.

The material used in radiation-absorbing layer 36 may be a dye such as the dyes specified in commonly assigned U.S. Pat. No. 4,973,572 (DeBoer) and U.S. Pat. No. 5,578,416 (Tutt), or a pigment such as carbon black. Radiation-absorbing layer 36 may be a metal such as chromium, nickel or titanium, or a layered stack of materials that absorb radiation by virtue of their antireflection properties. The main criteria is that radiation-absorbing layer 36 absorb laser light, at the given wavelength, at a high enough intensity for transfer of material from resist layer 38. The efficiency of this transfer is well known to depend on the laser fluence, spot size, beam overlap and other factors. Generally, the optical density of radiation-absorbing layer 36 should be at least 0.1 (20% of the light is absorbed).

Radiation-absorbing layer 36, in addition to having a light-absorbing material, may preferably contain polymeric binders or amorphous organic solids. These binders and solids are preferably thermally labile or gas-producing substances such as polycyanoacrylate, nitrocellulose, copolymers of maleic anhydride, and materials disclosed in U.S. Pat. No. 6,190,827 (Weidner) and U.S. Pat. No. 6,165,671 (Weidner et al.) and references cited therein, as components of a propellant layer in laser donor elements. Radiation-absorbing layer 36 may also contain other polymeric and organic solids necessary to ensure the physical integrity of the layer.

Resist layer 38 may comprise a polymeric binder, an amorphous organic solid, and a particle or spherical bead. Alternatively, resist layer 38 may also contain a mixture of these materials and radiation-absorbing materials and thermally labile substances as described with reference to radiation-absorbing layer 36.

The polymeric binders of layer 38 may include polymers known to provide resist properties in lithographic processes, such as Shipley G-Line or Microposit™ photoresists from Shipley Company, Marlborough, Mass., and including materials such as polymethacrylates and acrylates, polystyrene and copolymers with butadiene, acrylates and methacrylates, acrylonitrile, polyesters, polyamides, polyimides, polyvinylchlorides and copolymers with vinyl acetate, polyvinyl esters, polyurethanes, polyvinyl acetals and butyrals, epoxides, polyimides, Novolac resins, polyvinyl phenol resins, and the like.

The amorphous organic solids of resist layer 38 may be monomeric resins as described in previously cited U.S. Pat. No. 6,165,671, such as hydrogenated and partially hydrogenated rosin esters and similar rosin esters. Commercially available materials include the glycerol ester of hydrogenated wood rosin, such as Staybellite Ester 10 (Hercules), the glycerol ester of hydrogenated rosin, such as Foral 85

(Hercules) and the pentaerythritol ester of modified rosin, such as Pentalyn 344 (Hercules). The amorphous organic solids of layer 38 may also include monomeric glassy solids as described in commonly-assigned U.S. Pat. No. 5,891,602 (Neumann), as binder elements in a dye donor laser transfer sheet. The amorphous organic solids of layer 38 may also be oligomeric resins with a molecular weight of less than about 4000 such as the polyester tone 260.

Spacing Elements

The particles, beads, or other spacing elements, such as spacers 88 in FIG. 4, used between donor element 12 and substrate 18 may be any of a number of types of regularly or irregularly shaped or spherical particle, either organic or inorganic in composition. Spacing elements can be of a size between about 0.1 and 100 microns, and are preferably of somewhat uniform size in the range of about 1 to 20 microns in diameter.

The use of spacers for maintaining gap G between donor element 12 and substrate 18 is described in more detail in commonly assigned U.S. Patent Application Publication No. 2003/0162108 (Burberry et al.); the disclosure of which is incorporated herein by reference. Examples of spacing beads are disclosed in U.S. Pat. No. 4,876,235 (DeBoer).

Spacers 88 or other spacing elements may be embedded in resist layer 38 or may be formed within radiation-absorbing layer 36 or donor support 34, or may be formed within any combination of these three layers. Spacing elements could alternately be formed on the surface of substrate 18 or could be introduced onto either surface prior to resist pattern transfer processing. As yet another alternative, the roughness of either donor element 12 or substrate 18 could be used to provide gap G.

Any of the layers of donor element 12 may include, in addition to the materials already disclosed, surface active agents necessary as coating aids and used for the modification of surface properties, hardeners, adhesion promoting agents, and the like, necessary for the physical integrity and manipulation of the manufactured devices. Dyes and pigments may also be added to any of the layers of donor element 12 to provide process visualization.

The donor element 12 substrate can be any self supporting material including sheet material, for example, metal or polymer film. The preferred embodiment of this invention the receiver support is Polyester (such as Estar™).

Examples of material that could be patterned are all etchable metals or conductors, semiconductors, dielectrics and polymers. Examples that follow show materials that can be patterned using thermoresist and laser etching. Some metals or conductors commonly used with these resists are aluminum, titanium, silver, gold, chromium, tin, ITO, platinum, etc. Semiconductors commonly used include poly silicon, amorphous silicon, doped silicon, gallium arsenide (GaAs), gallium nitride (GaN), Indium antimonide (InSb), germanium, and others. Some commonly used dielectrics include single or multiple layers of combinations of silicon nitride, silicon oxide, silicon oxynitride, metal oxide including aluminum oxide, titanium oxide, and organic materials including benzocyclobutene (BCB), spin-on glass, acrylic, Teflon, polyimide, and others. Commonly used polymers include cellulose triacetate, poly thiophene, etc.

The receiver substrate can be any self-supporting material including, for example, metal, glass, silicon, and polymer film. In one embodiment of this invention, substrate 18 is glass.

The transfer atmosphere can be vacuum, atmosphere, or ultra low humidity environments. The lighting can be complete darkness, yellow light (no UV), full spectrum light or standard room lighting with incandescent or fluorescent lights.

The etch process used can be done in vacuum, using plasma with a reactive ion etch, with a plasma torch, or with wet etches. Examples of etch gases used for plasma etching include $Cl_2$, $BCl_3$, $SF_6$, $O_2$, $H_2$, $CH_4$, chloroform and $N_2$. Exemplary wet etches include HCl, nitric acid, acidic acid, phosphoric acid, ferric chloride, and ferric nitrate.

EXAMPLE 1

A donor element comprising a 102 microns polyethylene teraphthalate support containing a subbing layer of 0.43 g/m2 gelatin hardened with dihydroxydioxane was subsequently coated with a transfer assist layer containing (0.332 g/m2) polycyanoacrylate, (0.054 g/m2) IR dye 1, with the following structure:

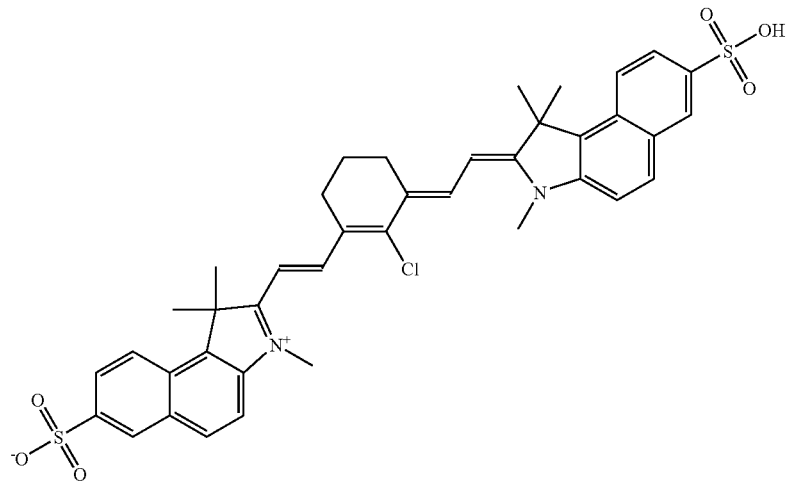

-continued

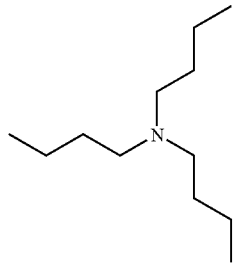

from a mixture of cyclopentanone, N-methylpyrollidone, and methanol with 0.01 wt % surfactant Silwet L7001 (GE Silicones). This assembly was then overcoated with the resist transfer layer comprising (1.08 g/m2) Foral 85 (hydrogenated rosin ester, Hercules Corp.) binder, (1.08 g/m2) Organic Pigment T-11 from DayGlo Corporation (solid dye solution in a Thermoset Resin Bead of 4–5 micron diameter), (0.118 g/m2) polyvinyl butyral, (0.027 g/m2) Rhodamine 6G dye, and DC1248 (Dow Corning), a silicone surfactant at 0.02 wt % of the solution, from a mixture of methyl ethyl ketone and ethyl alcohol.

Donor element 12 was placed on substrate 18, which was composed of a glass plate coated with 500 angstroms of aluminum, with the resist coated side adjacent to the aluminum on the substrate surface. Laser transfer of thermoresist material was effected from donor element 12 to substrate 18 by irradiation of donor element 12 through substrate 18 with an infrared laser beam. The beam size was approximately 16 micrometers by 80 micrometers to the $1/e^2$ point scanning along the wide beam direction. The dwell time was 27 microseconds with a suitable power density. Transfer was effected in regions, which were desired to be covered by the resist material, and in which the aluminum was to remain after etching.

Donor element 12 was removed after resist transfer, and the sample placed in a Lam model 4600 chlorine based plasma etch tool, product of Lam Research Corporation, Fremont, Calif. The pattern was etched into the metal layer. The sample was then placed in an oxygen plasma asher and the remaining thermoresist material removed. This process transferred the laser resist pattern into the aluminum. Removal of the resist resulted in an aluminum pattern with high fidelity with a completely dry patterning process. Some pinholes were observed where the beads shadowed the transfer process.

EXAMPLE 2

For this two-pass example, the steps of Example 1 were completed in a first pass. Then, as the second pass, a second resist material was applied, this time where no spacer particles or beads were used between donor element 12 and substrate 18. This is permissible since existing structures formed in the first pass provide the needed gap G (FIG. 4). That is, for the second pass, existing surface features 74 that were formed during the first pass effectively act as spacers, eliminating the need for spacers 88 as were shown in FIG. 4. Donor element 12 for the second pass used a 4 mil PET support, coated with a first subbing layer of tetrabutoxy titanate (Tyzor TBT, Dupont) coated from a mixture of n-butanol and n-propyl acetate, and a second transfer layer of 0.16 g/m2 cellulose acetate propionate, 0.054 g/m2 IR-2, 0.077 g/m2 Cyan Dye 1, with structure:

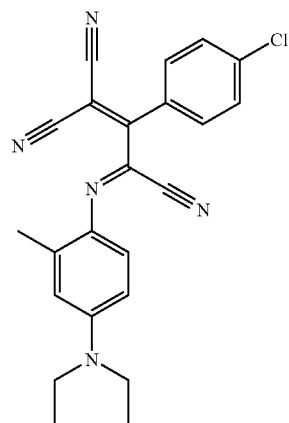

0.075 Magenta Dye 1, with structure:

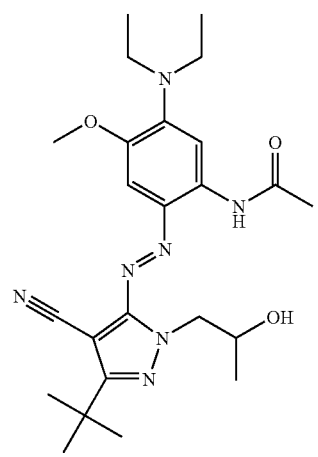

0.069 g/m2 Yellow Dye 1, with structure:

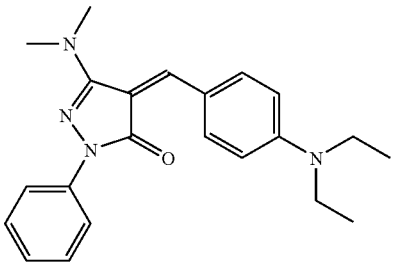

coated from a mixture of MIBK (40%), n-propyl acetate (20%), proylene glycol monomethyl ether (20%) and methanol (10%).

This second resist transfer was applied directly over the first resist pattern such that the second transfer exactly matched the first pattern. The registration was accomplished by replacing the first donor element 12 with the second donor element 2, while not removing receiver substrate 18 from the laser stage platform, then performing the laser-activated transfer using the same pattern as was used for the first pattern. After the second transfer, the display substrate was subjected to the same chlorine etch and O2 plasma cleaning as in Example 1. This secondary transfer mitigated bead shadowing, resulting in improved conductor line quality.

EXAMPLE 3

This example followed the same process steps as those described for Examples 1 or 2, with minor exceptions, as follows:
  (i) the coated material on the glass substrate is poly silicon; and
  (ii) the etch gas atmosphere is sulfur hexafluoride.

EXAMPLE 4

For this next example, an overcoat was applied to donor element 12 and radiation-absorbing layer 36 of Example 1. The overcoat was a thermoresist transfer layer comprising 1.51 g/m2 Staybilite 10 (a Rosin Ester), 0.116 g/m2 polyvinylbutyral, 0.016 g/m2 IR Dye 2, 0.054 g/m2 Cyan Dye 1, 0.0038 g/m2 divinylbenzene beads (4 microns diameter) and DC1248 surfactant from Dow Corning at 0.036 wt % of the coating solution, with methylethyl ketone solvent. This layer was transferred in a pattern to substrate 18 as in Example 1, and a second identical pattern was transferred, without separating elements, as in Example 2. The chlorine etch followed by the O2 plasma cleaning was performed as in Examples 1 and 2 to provide the aluminum conductor pattern.

Observations

In various embodiments transfer thermoresist layer 38 is comprised of one or more polymeric resins, 10 grams per meter square, preferably 1 to 2 grams per meter square of molecular weight 1000 to 2 million preferably 50,000 to 200,000. The transfer thermoresist layer can be composed of monomeric glasses with a typical molecular weight of 250 to 1000 and typical glass transition temperatures ranging from 25 to 175 degrees centigrade, preferably 40 to 100 degrees centigrade. As spacers 88 (FIG. 4), transfer thermoresist layer can include beads, typically 1 to 10 microns diameter, preferably 1 to 5 microns diameter. Beads of various materials, such as carbon, could be used, as described previously.

As Example 2 and subsequent examples show, there can be significant value in performing multiple-pass deposition using the method of the present invention, each pass with a fresh donor element 12. The pattern traced by laser beam 26 is the same for the first pass, the second pass, and any subsequent passes. The benefit of multiple pass deposition relates to shadowing effects caused by spacers 88. That is, a tiny "pinhole" can be caused where a particular spacer 88 obstructs a portion of feature 74 so that transferred resist layer 44 (FIG. 4) cannot be properly formed in a single pass. Where spacers 88 are used for the second pass, it is unlikely that the same area of substrate 18 will be blocked by a spacer 88 on two successive passes.

Figure 5:
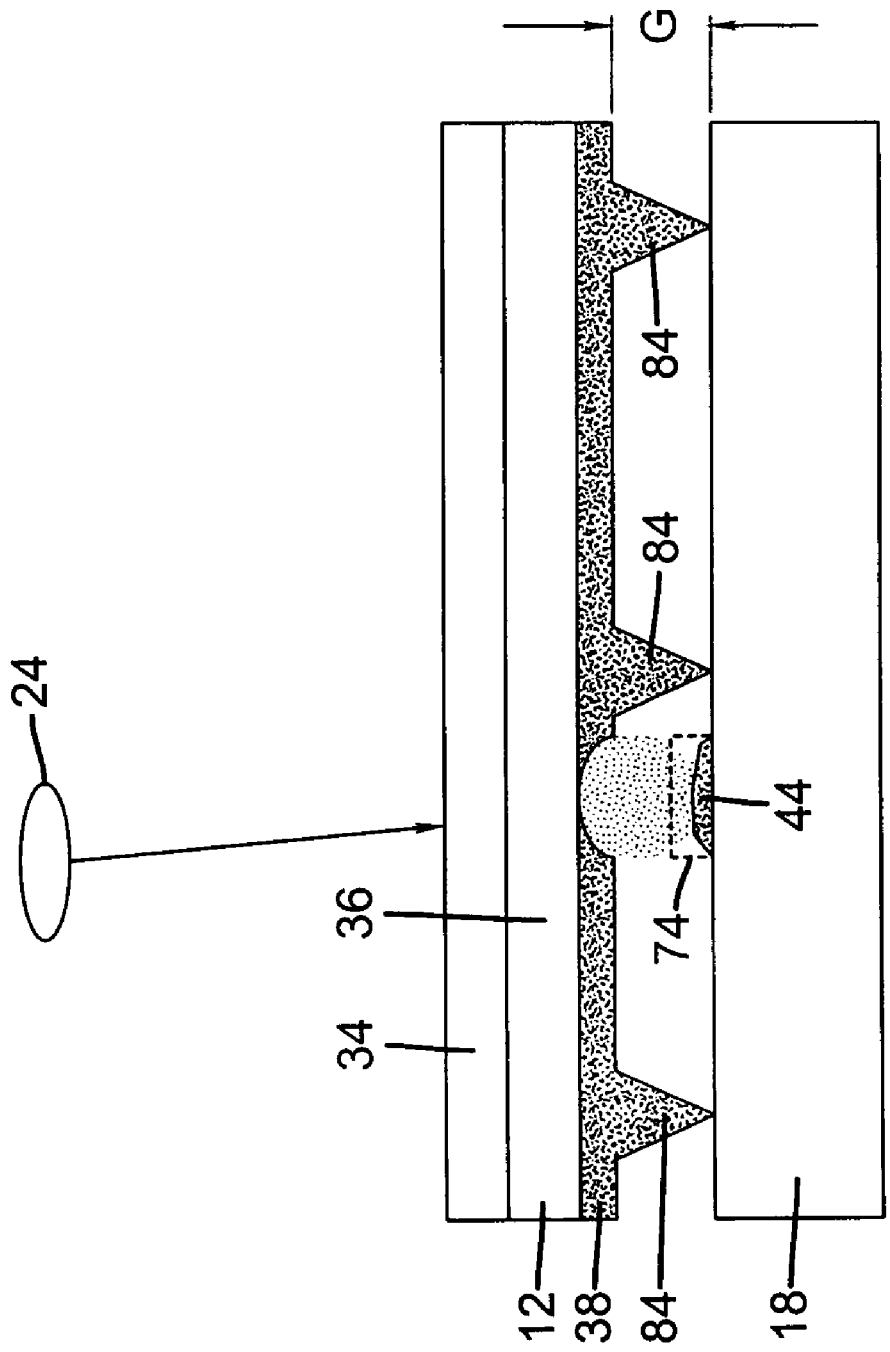
FIG. 5 is a cross-sectional side view, in an optional embodiment, showing components at the donor/substrate interface.

An alternative to spacers 88 for second and subsequent passes is noted in Example 2, above. That is, once some portion of features 74 are deposited, the surface of substrate 18 may be able to maintain sufficient gap G distance without requiring spacers 88. In yet another embodiment, spacing elements can be provided by surface roughness itself, at either the surface of substrate 18 or the surface of donor element 12. In one embodiment, the surface of resist layer 38 is featured with peaks 84 so that donor element 12 effectively supports itself over substrate 18, maintaining gap G as shown in FIG. 5.

By maintaining gap G between donor element 12 and receiver substrate 18, the ablative transfer method of the present invention offers advantages over other transfer methods such as the adhesion transfer method described in the background section given earlier. One significant advantage relates to thermal isolation. Heat that is generated in order to effect transfer is effectively buffered or insulated from reaching the surface of receiver substrate 18 by air, or other gas, within gap G. This is particularly beneficial where substrate 18 has high thermal conductivity, such as would be true of a metallic material, for example. A highly thermal conductive surface could draw excessive amounts of heat from the transfer area, even inhibiting transfer in some cases. This inherent thermal isolation also makes ablative transfer more promising for use with organic materials or flexible substrates that may be sensitive to heat. Yet another advantage of ablative transfer relates to the tendency of the donor material to stick to the wrong surface, as was described with reference to adhesion transfer in FIG. 2. In ablative transfer, a gap distance is maintained between the donor and receiving surface, minimizing any bonding between deposited and non-deposited donor material, thus reducing or eliminating the likelihood that, when the donor sheet is pulled away, donor material is unintentionally removed from the receiving surface or that excessive donor material is removed from the donor element and clings to the receiving surface.

Fabrication System

Figure 6:
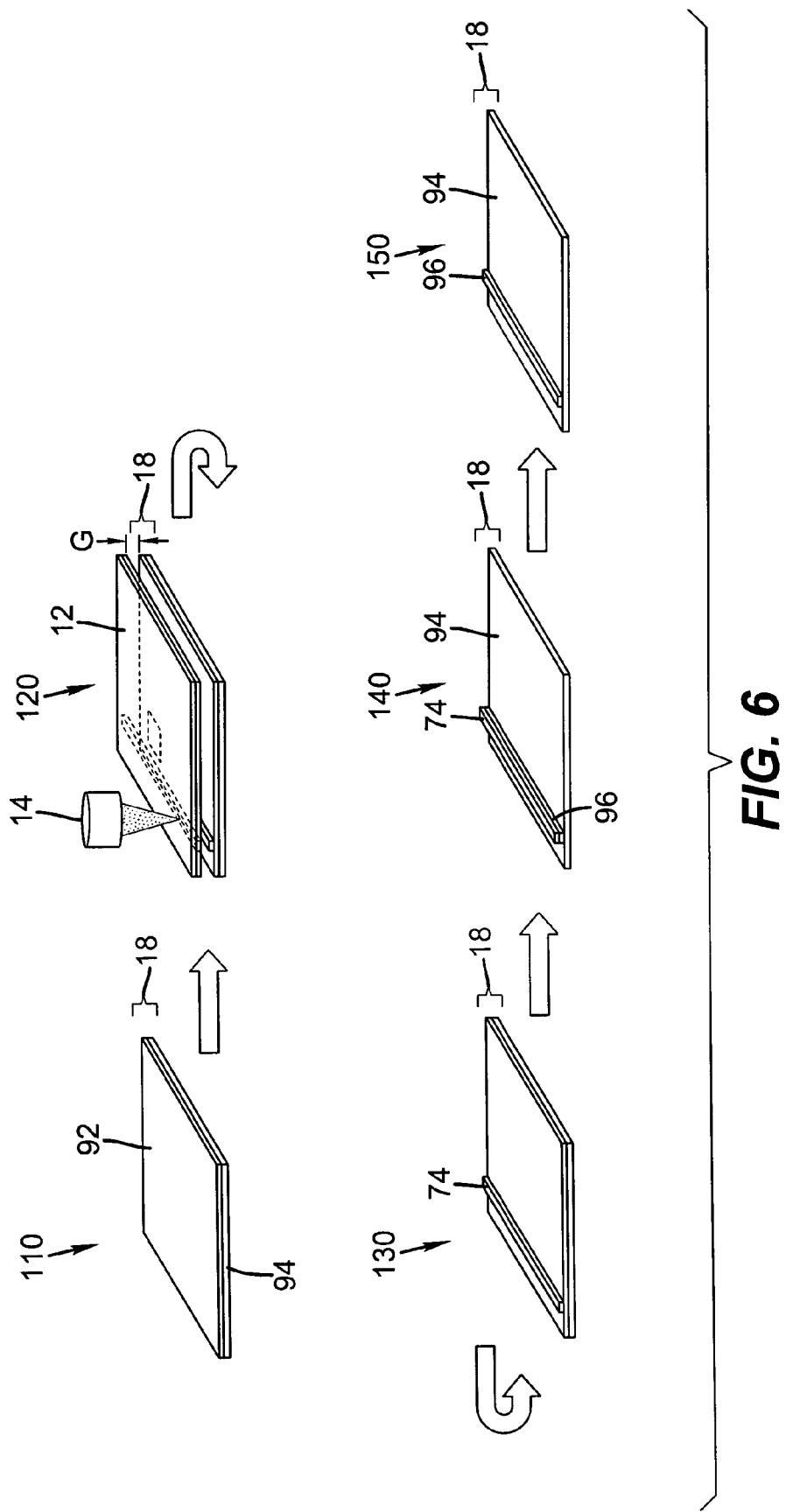
FIG. 6 is a block diagram showing process steps for forming a surface element using the methods and apparatus of the present invention.

Referring to FIG. 6, there is shown a block diagram of the steps used in a fabrication system for applying a pattern of a material 92 onto substrate 18 using the method of the present invention. The process executed by such a fabrication system is a dry fabrication process, eliminating drying stages, liquid etchants, and liquid coating processes. In an entry step 110, substrate 18 has a support 94 coated with material 92. In a thermoresist deposition step 120, donor element 12 is positioned in proximity to substrate 18, separated by gap G. Laser 14 writes feature 74, a trace line in the example shown, transferring thermoresist material from donor element 12 onto substrate 18. In a donor removal step 130, donor element 12 is removed. Thermoresist deposition step 120 and donor removal step 130 may be repeated for multiple passes, as described earlier. A material etching step 140 etches material 92 from the surface of support 94, except where protected by thermoresist, that is, beneath feature 74. In a resist etching step 150, feature 74 is itself etched from the surface, leaving a trace 96, or other patterned element, that is made of the original material 92.

The sequence of FIG. 6 is greatly simplified, showing only the basic process for forming a single element onto substrate 18. As would be clear to one skilled in the microfabrication arts, the processes shown in FIG. 6 would be repeated a number of times in order to form circuit components onto substrate 18.

The invention has been described in detail with particular reference to certain preferred embodiments thereof, but it will be understood that variations and modifications can be effected within the scope of the invention. For example, while most thermoresists are activated by IR or near-IR radiation, this method could also be used with a thermoresist activated by sufficiently intense visible or UV light. Laser scanning mechanisms could include flat platen as well as drum embodiments, such as a vacuum drum, for example. Auxiliary cleaning steps might be needed following thermoset deposition (with respect to FIG. 6, following thermoresist deposition step 120), including the use of etchant. The method of the present invention can be used with either plasma or liquid etchants, as is most suitable for the device being fabricated. Material 92 (FIG. 6) could be a metal, organic or inorganic semiconductor, or an organic or inorganic dielectric material, for example.

Thus, what is provided is an apparatus and method for fabrication of microelectronic devices using a dry process with a resist formed by ablative laser transfer.

PARTS LIST

10 patterning apparatus
12 donor element
14 laser
18 substrate
22 galvanometer
24 lens
26 laser beam
28 control logic processor
30 control line
32 translation stage
34 donor support
36 radiation-absorbing layer
38 resist layer
44 transferred resist portion
68 transfer layer
70 donor sheet
72 support
74 feature
76 excess portion
78 torn portion
88 spacer
92 material
94 support
96 trace
100 patterning apparatus
110 entry step
120 thermoresist deposition step
130 donor removal step
140 material etching step
150 resist etching step

The invention claimed is:

1. A method for forming a resist pattern on a substrate comprising:
   a) placing a donor element comprising a layer of thermoresist material proximate the substrate;
   b) maintaining a zap such that a surface of the layer of thermoresist material is spaced apart from the surface of the substrate by a plurality of spacing elements;
   c) directing thermal energy toward the donor element according to said resist pattern, whereby a portion of thermoresist material is transferred from the donor element across the zap by ablative transfer and is deposited onto the substrate, forming the resist pattern;
   wherein the donor element is comprised of a support, a transfer assist layer, and a transfer thermoresist layer; and
   wherein the transfer thermoresist layer comprises polymeric resins, monomeric glasses, light to heat converting substance, and beads.

2. A method as in claim 1 wherein the spacing elements are particles on the surface of the substrate.

3. A method as in claim 1 wherein the spacing elements are particles on the surface of the layer of thermoresist material.

4. A method as in claim 1 wherein the spacing elements are microbeads on the surface of the substrate.

5. A method as in claim 1 wherein the spacing elements are microbeads on the surface of the layer of thermoresist material.

6. A method as in claim 1 wherein the spacing elements are organic particles on the surface of the layer of thermoresist material.

7. A method as in claim 1 wherein the spacing elements are microbeads embedded on the surface of the substrate.

8. A method as in claim 1 wherein the spacing elements are microbeads embedded on the surface of the layer of thermoresist material.

9. A method as in claim 1 wherein the spacing elements are surface features on the surface of the substrate.

10. A method as in claim 1 wherein the spacing elements are surface features on the surface of the layer of thermoresist material.

11. A method as in claim 1 wherein heat or pressure or both are applied to enhance contact between the donor element and the substrate.

12. A method as in claim 1 wherein the transfer thermoresist layer is 0.25 to 10 microns thick.

13. A method as in claim 1 wherein the beads are 1 to 10 microns diameter preferably 1 to 5 microns diameter.

14. A method as in claim 1 wherein the beads are carbon.

15. A method as in claim 1 wherein the transfer of said pattern of thermoresist material is caused by optical radiation.

16. A method as in claim 1 wherein the transfer of said pattern of thermoresist material is caused by thermal heating.

17. A method as in claim 1 wherein the transfer of said pattern of thermoresist material is caused by pressure.

18. A method as in claim 1 wherein the step of directing a thermal energy toward the donor element according to the resist pattern comprises using a mask.

19. A method as in claim 1 wherein the step of directing a thermal energy toward the donor element according to the resist pattern comprises energizing a laser.

20. A method according to claim 19 wherein the laser emits predominantly near IR wavelengths.

21. A method according to claim 1 wherein the spacing elements are formed in the surface of the donor element.

22. A method as in claim 1 wherein said layer of material not covered by said resist pattern is plasma etched.

23. A method as in claim 1 wherein vacuum is applied to enhance contact between the donor element and said substrate.

24. A method of making microelectronic devices comprising:
   a) placing a donor element comprising a layer of thermoresist material proximate a substrate;
   b) maintaining a gap such that a surface of the layer of thermoresist material is spaced apart from the surface of the substrate by a plurality of spacing elements;
   c) directing a thermal energy toward the donor element according to a resist pattern, whereby a portion of thermoresist material is transferred from the donor element across the gap by ablative transfer and is deposited onto the substrate, forming the resist pattern;
   d) removing the donor element;
   e) etching the substrate to remove material not covered by the resist pattern; and
   f) removing the resist pattern.

25. A method as in claim 24 wherein the pattern is optically transferred from a photomask.

26. A method as in claim 24 wherein the pattern is directly written from an optically modulated light beam.

27. A method as in claim 24 wherein directing a radiant energy comprises the step of energizing a laser.

28. A method as in claim 24 comprising the additional step of: hardening the pattern of resist material prior to etching.

29. A method as in claim 19 wherein the hardening is by optical radiation.

30. A method as in claim 19 wherein the hardening is by formal heating.

31. A method as in claim 19 wherein the hardening is by chemical modification.

32. A method of making microelectronic devices comprising:
   a) placing a donor element comprising a layer of thermoresist material proximate a substrate;
   b) maintaining a gap such that a surface of the layer of thermoresist material is spaced apart from the surface of the substrate by a plurality of spacing elements;
   c) directing a thermal energy toward the donor element according to a resist pattern, whereby a portion of thermoresist material is transferred from the donor element across the gap by ablative transfer and is deposited onto the substrate, forming the resist pattern;
   d) directing light energy toward the donor element for at least one additional time, according to the resist pattern;
   e) removing the donor element;
   f) etching the substrate to remove material not covered by the resist pattern; and
   g) removing the resist pattern.

33. A method of making microelectronic devices comprising:
   a) placing a donor element comprising a layer of thermoresist material proximate a substrate;
   b) maintaining a gap such that a surface of the layer of thermoresist material is spaced apart from the surface of the substrate by a plurality of spacing elements;
   c) directing a thermal energy toward the donor element according to a resist pattern, whereby a portion of thermoresist material is transferred from the donor element across the gap by ablative transfer and is deposited onto the substrate, forming the resist pattern;
   d) directing light energy toward the donor element for at least one additional time, according to the resist pattern;
   e) removing the donor element;
   f) depositing an overlying layer of material; and
   g) removing the resist pattern and material overlying the resist pattern.

34. A method of making microelectronic devices comprising:
   a) placing a first donor element comprising a layer of a first thermoresist material proximate a substrate;
   b) maintaining a gap such that a surface of the layer of the first thermoresist material is spaced apart from the surface of the substrate by a plurality of spacing elements;
   c) directing a thermal energy toward the donor element according to a resist pattern, whereby a portion of the first thermoresist material is transferred from the first donor element across the gap by ablative transfer and is deposited onto the substrate, forming the resist pattern; and
   d) replacing the first donor element with a second donor element comprising a layer of a second thermoresist material and repeating steps b) and c) to transfer the second thermoresist material from the second donor element onto the substrate, forming a resist pattern thereby.

35. The method of claim 34 further comprising:
   e) depositing an overlying layer of material onto the resist pattern on the substrate; and
   f) removing a portion of the layer of material overlying the resist pattern.

* * * * *

UNITED STATES PATENT AND TRADEMARK OFFICE
CERTIFICATE OF CORRECTION

| | |
|---|---|
| PATENT NO. | : 7,198,879 B1 |
| APPLICATION NO. | : 11/240964 |
| DATED | : April 3, 2007 |
| INVENTOR(S) | : Timothy J. Tredwell et al. |

It is certified that error appears in the above-identified patent and that said Letters Patent is hereby corrected as shown below:

Claim 1, Line 5 (Column 16, Line 8)  In Claim 1, delete "zap" and insert --gap--, therefor.

Claim 1, Line 11 (Column 16, Line 14)  In Claim 1, delete "zap" and insert --gap--, therefor.

Signed and Sealed this

Twenty-seventh Day of May, 2008

JON W. DUDAS
*Director of the United States Patent and Trademark Office*